United States Patent
Li et al.

(10) Patent No.: US 10,102,898 B2
(45) Date of Patent: Oct. 16, 2018

(54) FERROELECTRIC-MODULATED SCHOTTKY NON-VOLATILE MEMORY

(71) Applicant: QUALCOMM Incorporated, San Diego, CA (US)

(72) Inventors: Xia Li, San Diego, CA (US); Jeffrey Junhao Xu, San Diego, CA (US); Seung Hyuk Kang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/829,004

(22) Filed: Dec. 1, 2017

(65) Prior Publication Data
US 2018/0190338 A1    Jul. 5, 2018

Related U.S. Application Data

(60) Provisional application No. 62/440,427, filed on Dec. 30, 2016.

(51) Int. Cl.
G11C 11/22     (2006.01)
G11C 13/00     (2006.01)
(Continued)

(52) U.S. Cl.
CPC .......... *G11C 11/2275* (2013.01); *G11C 11/22* (2013.01); *G11C 11/223* (2013.01);
(Continued)

(58) Field of Classification Search
CPC ............................ G11C 11/22; G11C 13/003
See application file for complete search history.

(56) References Cited

U.S. PATENT DOCUMENTS 5,757,042 A * 5/1998 Evans, Jr. ............... G11C 11/22
                                                                257/295
5,789,775 A * 8/1998 Evans, Jr. ............... G11C 11/22
                                                                257/295
(Continued)

FOREIGN PATENT DOCUMENTS

| CN | 105720188 A | 6/2016 |
|----|-------------|--------|
| EP | 0936675 A2 | 8/1999 |
| WO | 2018068266 A1 | 4/2018 |

OTHER PUBLICATIONS

International Search Report and Written Opinion for PCT/CN2016/102017, dated Jul. 18, 2017, 11 pages.
(Continued)

*Primary Examiner* — Hoai V Ho
*Assistant Examiner* — Jay Radke
(74) *Attorney, Agent, or Firm* — Withrow & Terranova, PLLC

(57) ABSTRACT

Ferroelectric-modulated Schottky non-volatile memory is disclosed. A resistive memory element is provided that is based on a semiconductive material. Metal elements are formed on a semiconductive material at two places such that two semiconductor-metal junctions are formed. The semiconductive material with the two semiconductor-metal junctions establishes a composite resistive element having a resistance and functions as a relatively fast switch with a relatively low forward voltage drop. Each metal element may couple a terminal to the resistive element. To provide a resistive element capable of being a resistive memory element to store distinctive memory states, a ferroelectric material is provided and disposed adjacent to the semiconductive material to create an electric field from a ferroelectric dipole. The orientation of the ferroelectric dipole
(Continued)

changes the resistance of the resistive element to allow it to function as a resistive memory element.

18 Claims, 13 Drawing Sheets

(51) Int. Cl.
| | |
|---|---|
| *H01L 21/02* | (2006.01) |
| *H01L 27/1159* | (2017.01) |
| *H01L 29/49* | (2006.01) |
| *H01L 29/47* | (2006.01) |
| *H01L 29/51* | (2006.01) |
| *H01L 29/16* | (2006.01) |
| *H01L 21/768* | (2006.01) |
| *H01L 29/66* | (2006.01) |
| *H01L 29/78* | (2006.01) |
| *H01L 21/28* | (2006.01) |
| *H01L 29/786* | (2006.01) |

(52) U.S. Cl.
CPC ...... *G11C 13/003* (2013.01); *H01L 21/02148* (2013.01); *H01L 21/02197* (2013.01); *H01L 21/02532* (2013.01); *H01L 21/28291* (2013.01); *H01L 21/76841* (2013.01); *H01L 21/76877* (2013.01); *H01L 21/76897* (2013.01); *H01L 27/1159* (2013.01); *H01L 29/16* (2013.01); *H01L 29/47* (2013.01); *H01L 29/495* (2013.01); *H01L 29/516* (2013.01); *H01L 29/517* (2013.01); *H01L 29/6684* (2013.01); *H01L 29/66643* (2013.01); *H01L 29/66765* (2013.01); *H01L 29/7839* (2013.01); *H01L 29/78391* (2014.09); *H01L 29/78669* (2013.01); *H01L 29/78678* (2013.01)

(56) References Cited

U.S. PATENT DOCUMENTS

| | | | |
|---|---|---|---|
| 8,149,609 | B2 | 4/2012 | Nagashima |
| 9,093,163 | B2 | 7/2015 | Wunderlich et al. |
| 9,583,704 | B2 | 2/2017 | You et al. |
| 2002/0011613 | A1 | 1/2002 | Yagishita et al. |
| 2004/0061153 | A1 | 4/2004 | Misewich et al. |
| 2011/0299318 | A1 | 12/2011 | Kaneko et al. |
| 2014/0016395 | A1 | 1/2014 | Kaneko |
| 2015/0249096 | A1 | 9/2015 | Lupino et al. |
| 2016/0086648 | A1 | 3/2016 | Dol |
| 2016/0118405 | A1 | 4/2016 | Ramaswamy et al. |
| 2017/0047116 | A1 | 2/2017 | Sandhu et al. |
| 2017/0053906 | A1 | 2/2017 | Or-Bach et al. |

OTHER PUBLICATIONS

Böscke, T. S. et al., "Ferroelectricity in Hafnium Oxide Thin Films", Applied Physics Letters, vol. 99, No. 10, Sep. 5, 2011, 3 pages.

Chen, Kuen-Yi et al., "Ferroelectricity of Low Thermal-Budget HfAlOx for Devices With Metal-Ferroelectric-Insulator-Semiconductor-Structure," RSC Advances, vol. 6, No. 78, Jan. 1, 2016, pp. 74445-74452.

Chernikova, Anna et al., "Ultrathin Hf 0.5 Zr 0.5 O2 Ferroelectric Films on Si," ACS Applied Materials & Interfaces, vol. 8, No. 11, Mar. 14, 2016, pp. 7232-7237.

Kaneko, Yukihiro et al., "A Dual-Channel Ferroelectric-Gate Field-Effect Transistor Enabling NAND-Type Memory Characteristics," IEEE Transactions on Electron Devices, vol. 58, No. 5, May 1, 2011, pp. 1311-1318.

Tokumitsu, E. et al., "Use of Ferroelectric Gate Insulator for Thin Film Transistors With ITO Channel," Microelectronic Engineering, vol. 80, Jun. 17, 2005, pp. 305-308.

International Search Report and Written Opinion for PCT/US2017/064455, dated Mar. 22, 2018, 18 pages.

* cited by examiner

FERROELECTRIC-MODULATED SCHOTTKY NON-VOLATILE MEMORY

PRIORITY CLAIM

The present application claims priority under 35 U.S.C. § 119(e) to U.S. Provisional Patent Application Ser. No. 62/440,427, filed on Dec. 30, 2016 and entitled "FERROELECTRIC-MODULATED SCHOTTKY NON-VOLATILE MEMORY," the contents of which is incorporated herein by reference in its entirety.

BACKGROUND

I. Field of the Disclosure

The technology of the disclosure relates generally to memory elements for use in integrated circuits.

II. Background

Computing devices have become increasingly prevalent throughout society. Consumer pressure for faster and smaller devices, coupled with a general adherence to Moore's Law, has allowed increasing amounts of computing power to be put into increasingly small integrated circuits (ICs) with increasingly fast clock speeds. Such increased computing power requires ever increasing memory capabilities. Memory elements face many of the same pressures that other ICs face to shrink size, reduce power consumption to improve battery life, and increase access speed.

Existing computing devices may employ static random access memory (SRAM) to provide memory elements. A standard SRAM memory cell consists of a six (6) transistor (T) (6T) cell employing cross-coupled inverters for retention of data. SRAM is a volatile memory. While SRAM has proven a stable and relatively reliable memory element, the typical 6T SRAM cell results in a memory element that is comparatively large and consumes relatively high amounts of power. Thus, there has been an industry-wide push to find a suitable replacement for SRAM for memory storage.

Some memory element candidates for SRAM replacement may have a poor on current ($I_{on}$) to off current ($I_{off}$) ratio ($I_{on}/I_{off}$ ratio). The $I_{on}/I_{off}$ ratio is the ratio of the read current of a selected memory cell to the leakage current of an unselected cell. A high $I_{on}/I_{off}$ ratio is important to provide enough margin for distinguishing between a read operation and a write operation. An adequate margin is particularly important for low-power operations, because it is easier for noise to exceed small margins in low-power situations. Other memory element replacement candidates may be sub-optimal because they require a high current to achieve a desired phase change within the memory cell and consume power in excess of design criteria. Still other memory element candidates may be sub-optimal because current manufacturing processes do not provide a predictably and reliably high yield of usable devices. Still other memory element candidates may have operational properties that deteriorate over an expected period of use, making for an unacceptably short life cycle. Still other memory element candidates have, using current manufacturing techniques, been difficult to manufacture. Thus, there remains a need for a memory element that has a short write time, is a small-sized device, is easy to make, has a better $I_{on}/I_{off}$ ratio, has defect levels in the parts per billion (ppb) range, and/or is otherwise a superior option relative to SRAM.

SUMMARY OF THE DISCLOSURE

Aspects disclosed in the detailed description include ferroelectric-modulated Schottky non-volatile memory. In exemplary aspects disclosed herein, a resistive memory element is provided that is based on a semiconductive material. Metal elements are formed on the semiconductive material at two places such that two semiconductor-metal junctions are formed. These junctions are also known as Schottky junctions and form Schottky barriers. The semiconductive material with the two semiconductor-metal junctions establishes a composite resistive element having a resistance and functions as a relatively fast switch with a relatively low forward voltage drop. Each metal element may be used to couple a terminal to the resistive element. To provide a resistive element capable of being a resistive memory element to store distinctive memory states, a ferroelectric material is provided and disposed adjacent to the semiconductive material to create an electric field from a ferroelectric dipole. The orientation of the ferroelectric dipole changes the resistance of the resistive element to allow it to function as a resistive memory element. Controlling the orientation of the ferroelectric dipole controls in which of two or more resistive states the semiconductive material exists. A third terminal is provided to the ferroelectric material. To write to the resistive memory element, the orientation of the ferroelectric dipole created by the ferroelectric material can be changed by providing a voltage to the ferroelectric material through the third terminal while holding the two metal terminals of the resistive element at fixed voltages. To read from the resistive memory element, the third terminal is held at zero volts (0 V or a fixed voltage), and a small voltage can be applied to one metal terminal of the resistive element to determine the stored memory state as a function of its resistance. Such a structure formed with Schottky junctions can provide a suitably fast memory element with an acceptable on current ($I_{on}$) to off current ($I_{off}$) ratio ($I_{on}/I_{off}$ ratio) and an acceptably low write-energy requirement. Additionally, the ease of manufacturing may justify any area penalty imposed by the third terminal.

In this regard in one aspect, a resistive memory element is disclosed. The resistive memory element includes a semiconductive material comprising a first portion and a second portion. The resistive memory element also includes a first metal element positioned adjacent to the first portion to form a first Schottky junction with the semiconductive material. The resistive memory element also includes a second metal element positioned adjacent to the second portion to form a second Schottky junction with the semiconductive material. The resistive memory element also includes a ferroelectric material adjacent to the semiconductive material. The ferroelectric material is configured to generate an electric field into the semiconductive material based on a voltage applied to the ferroelectric material to change a Schottky barrier height and a resistance associated with the semiconductive material.

In another aspect, a method of fabricating a resistive memory element is disclosed. The method includes forming a write line in a first intermetal dielectric layer. The method also includes forming a diffusion barrier layer over the first intermetal dielectric layer. The method also includes forming a first metal layer such that the first metal layer is electrically coupled to the write line and forms a write terminal. The method also includes depositing a ferroelectric material over the first metal layer such that the ferroelectric material is electrically coupled to the write terminal. The method also includes depositing a semiconductive material over the ferroelectric material. The method also includes depositing a second metal layer on the semiconductive material. The method also includes depositing a third metal layer on the second metal layer. The method also includes forming a first metal terminal and a second metal terminal on the second metal layer. The method also includes forming a first portion and a second portion of a metal pattern on the semiconductive material to form two Schottky junctions. The method also includes depositing a second intermetal dielectric layer over the diffusion barrier layer, the first metal terminal, the second metal terminal, the semiconductive material, and the ferroelectric material. The method also includes forming vias in the second intermetal dielectric layer. The method also includes coupling a source line to the first metal terminal. The method also includes coupling a bit line to the second metal terminal.

In another aspect, a method of operating a resistive memory element is disclosed. The method includes determining a datum to be written to a resistive memory element. The method also includes selecting an orientation of a ferroelectric dipole in the resistive memory element to write the datum to the resistive memory element. The method also includes writing the datum to the resistive memory element by providing a voltage through a write terminal coupled to a ferroelectric material. The method also includes determining a resistance of the resistive memory element to read the datum stored therein.

DETAILED DESCRIPTION

Figure 1:
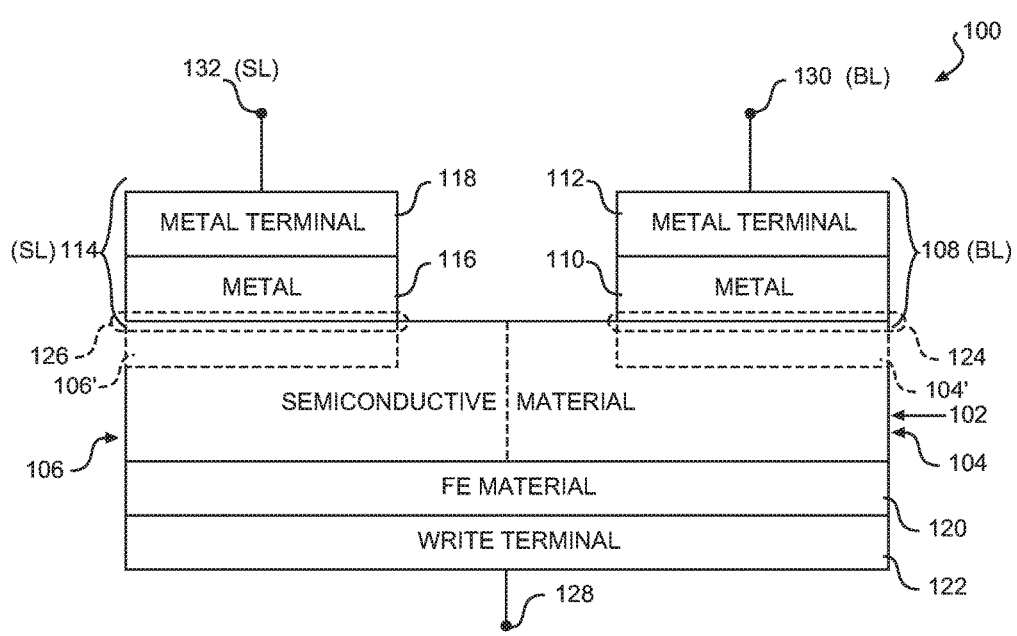
FIG. 1 is a schematic diagram of an exemplary resistive memory element formed from a semiconductive material having metal layers disposed on two portions to form Schottky junctions with a ferroelectric material adjacent to the semiconductive material capable of generating an electric field to control a memory state as a function of resistance.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include ferroelectric-modulated Schottky non-volatile memory. In exemplary aspects disclosed herein, a resistive memory element is provided that is based on a semiconductive material. Metal elements are formed on the semiconductive material at two places such that two semiconductor-metal junctions are formed. These junctions are also known as Schottky junctions and form Schottky barriers. The semiconductive material with the two semiconductor-metal junctions establishes a composite resistive element having a resistance and functions as a relatively fast switch with a relatively low forward voltage drop. Each metal element may be used to couple a terminal to the resistive element. To provide a resistive element capable of being a resistive memory element to store distinctive memory states, a ferroelectric material is provided and disposed adjacent to the semiconductive material to create an electric field from a ferroelectric dipole. The orientation of the ferroelectric dipole changes the resistance of the resistive element to allow it to function as a resistive memory element. Controlling the orientation of the ferroelectric dipole controls in which of two or more resistive states the semiconductive material exists. A third terminal is provided to the ferroelectric material. To write to the resistive memory element, the orientation of the ferroelectric dipole created by the ferroelectric material can be changed by providing a voltage to the ferroelectric material through the third terminal while holding the two metal terminals of the resistive element at fixed voltages. To read from the resistive memory element, the third terminal is held at zero volts (0 V or a fixed voltage), and a small voltage can be applied to one metal terminal of the resistive element to determine the stored memory state as a function of its resistance. Such a structure formed with Schottky junctions can provide a suitably fast memory element with an acceptable on current ($I_{on}$) to off current ($I_{off}$) ratio ($I_{on}/I_{off}$ ratio) and an acceptably low write-energy requirement. Additionally, the ease of manufacturing may justify any area penalty imposed by the third terminal In this regard, FIG. 1 is a simplified view of a resistive memory element 100. The resistive memory element 100 includes a semiconductive material 102, which in an exemplary aspect is a silicon (Si) material, although other materials such as silicon germanium (SiGe), germanium (Ge), gallium arsenide (GaAs), and other III-V semiconductors may be used as well, without departing from the scope of the present disclosure. The semiconductive material 102 includes a first portion 104 and a second portion 106. In an exemplary aspect, the first portion 104 and the second portion 106 form opposite ends of the semiconductive material 102. Further, while generally illustrated as a full one-half of the semiconductive material 102, the portions 104 and 106 may form smaller portions of the semiconductive material 102 as illustrated by 104' and 106'. A first electrode 108 (BL) may be associated with the first portion 104. In an exemplary aspect, the first electrode 108 may be formed from a first metal element 110 and a first metal terminal 112. The first metal element 110 may be formed from a metal such as nickel (Ni), and the first metal terminal 112 may be formed from a metal such as tungsten (W). The first electrode 108 is at least electrically coupled to the semiconductive material 102 and may be directly electrically coupled by being immediately adjacent to the semiconductive material 102. A second electrode 114 (SL) may be associated with the second portion 106. In an exemplary aspect, the second electrode 114 may be formed from a second metal element 116 and a second metal terminal 118. The second metal element 116 may be formed from a metal such as Ni, and the second metal terminal 118 may be formed from a metal such as W. The second electrode 114 is at least electrically coupled to the semiconductive material 102 and may be directly electrically coupled by being immediately adjacent to the semiconductive material 102.

With continued reference to FIG. 1, the semiconductive material 102 is also associated with a ferroelectric material 120 (referenced in drawings as "FE material"). In an exemplary aspect, the ferroelectric material 120 is a Hafnium zirconium oxide (HfZrO$_x$) material. Other materials such as Hafnium oxide (HfO$_2$), Hafnium aluminum oxide (HfAlO$_x$), Hafnium silicon oxide (HfSiO$_x$), or zirconium oxide (ZrO$_2$) may also be used. A write terminal 122 may be associated with the ferroelectric material 120. The write terminal 122 may be formed from a metal and is at least electrically coupled to the ferroelectric material 120 and may be directly electrically coupled by being immediately adjacent to the ferroelectric material 120. Given the first metal terminal 112 and the second metal terminal 118, the write terminal 122 may sometimes be referred to as a third metal terminal. It should be appreciated however, that the use of first, second, and third to refer to a particular terminal is a matter of stylistic convenience and is not intended to imply a particular order or sequence must exist for the terminals.

With continued reference to FIG. 1, a junction 124 between the semiconductive material 102 and the first electrode 108 (BL) forms a Schottky junction. Similarly, a junction 126 between the semiconductive material 102 and the second electrode 114 (SL) forms a second Schottky junction. The Schottky junctions may also be considered Schottky barriers. The semiconductive material 102 with the two junctions 124 and 126 establishes a composite resistive element having a resistance and functions as a relatively fast switch with a relatively low forward voltage drop. The ferroelectric material 120 is used to create an electric field that impinges upon the semiconductive material 102. In particular, the ferroelectric material 120 can create an electric field having a ferroelectric dipole facing towards the center of the semiconductive material 102 or outwardly away from the center of the semiconductive material 102. The ferroelectric dipole is better illustrated below with reference to FIGS. 2A and 2B. By changing the orientation of the ferroelectric dipole, the Schottky barrier height and the resistance of the semiconductive material 102 may be changed. Thus, controlling the orientation of the ferroelectric dipole controls in which of two resistive states the semiconductive material 102 exists. In effect, the two resistive states of the resistive memory element 100 are capable of representing logical highs and logical lows and can effectively represent binary data. The orientation of the ferroelectric dipole can be changed by providing a voltage to the ferroelectric material 120 through the write terminal 122 from a node 128 (write). To read from the resistive memory element 100, a smaller voltage may be applied to the resistive memory element 100 between nodes 130 (BL) and 132 (SL) through the first electrode 108 and the second electrode 114 to determine the stored memory state as a function of the resistance. The structure of the resistive memory element 100 is suitably fast and has an acceptable $I_{on}/I_{off}$ ratio while also having an acceptably low write-energy requirement. While the use of the write terminal 122 and the node 128 (write) adds to the space consumed by the resistive memory element 100, such space penalty is an appropriate trade-off relative to ease of manufacturing.

Figure 2A:
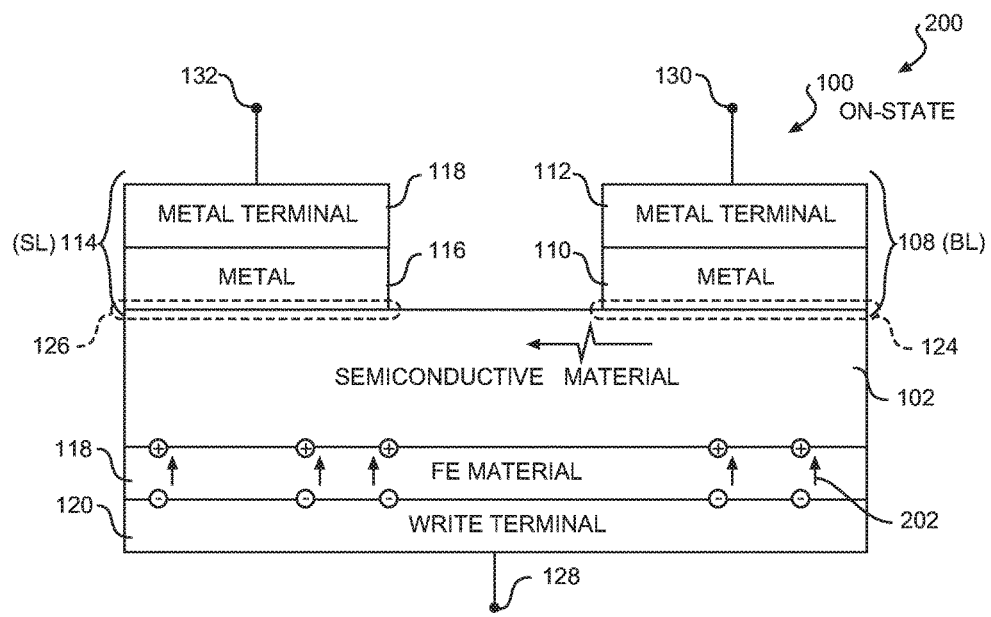
FIGS. 2A and 2B are schematic diagrams of the resistive memory element of FIG. 1 in an on-state and an off-state, respectively.
Figure 2B:
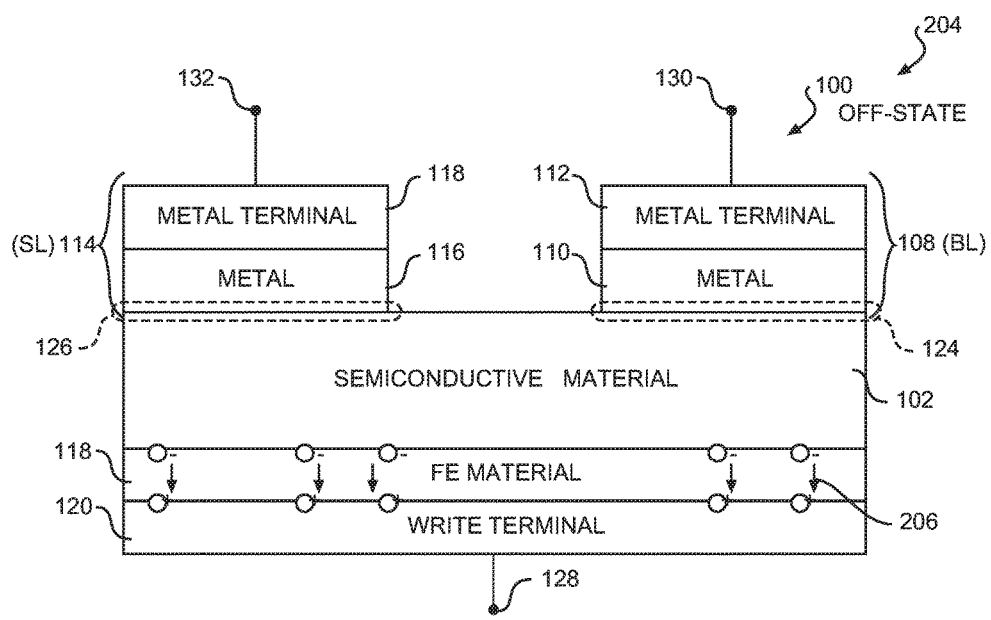
Figure 3A:
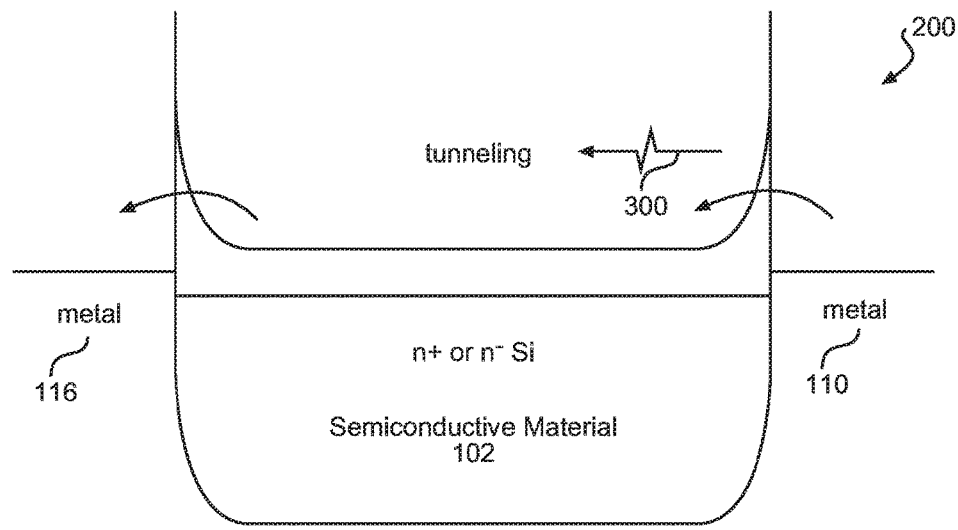
FIGS. 3A and 3B are band diagrams to illustrate electron tunneling associated with the two resistive states of the on-state and off-state, respectively.
Figure 3B:
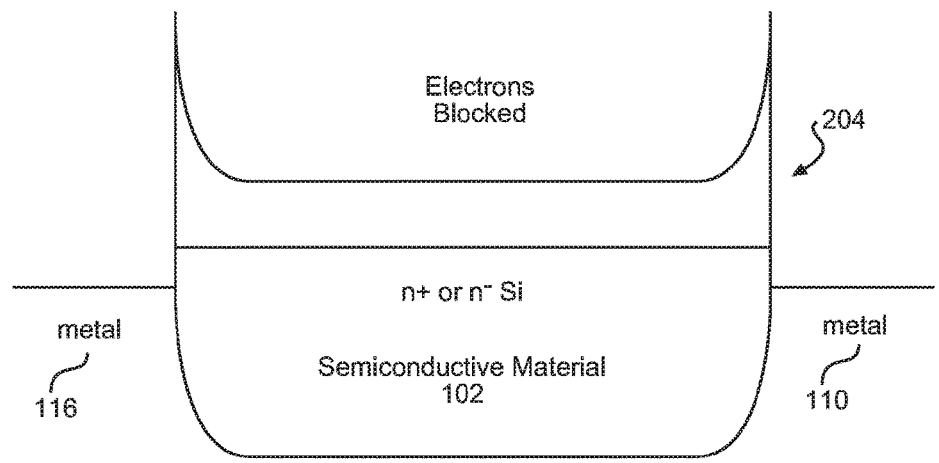

FIGS. 2A and 2B show the two resistive states of the resistive memory element 100 of FIG. 1. In an on-state 200, illustrated in FIG. 2A, the resistive memory element 100 has a low resistance, and the Schottky barrier height at the junction 124 is reduced by ferroelectric dipole 202 being directed inwardly towards the center of the semiconductive material 102. This on-state 200 allows tunneling electrons to flow through the semiconductive material 102. In contrast, in an off-state 204, illustrated in FIG. 2B, the resistive memory element 100 has a high resistance, and the Schottky barrier height at the junction 124 is increased by ferroelectric dipole 206 being directed outwardly away from the center of the semiconductive material 102. This off-state 204 blocks the tunneling electrons. The resistance of the resistive memory element 100 is sensed by a read voltage being applied between the first electrode 108 (BL) and the second electrode 114 (SL). Tunneling states are better illustrated by the band diagrams of FIGS. 3A and 3B, which correspond to the on-state 200 and the off-state 204, respectively. In particular, tunneling 300 is enabled in the on-state 200 and not enabled in the off-state 204. It should be appreciated that changing ferroelectric dipole orientation of the ferroelectric material 120 may be effectuated by a simple voltage pulse, and the ferroelectric material 120 will retain that ferroelectric dipole orientation without further energy being required.

Figure 4:
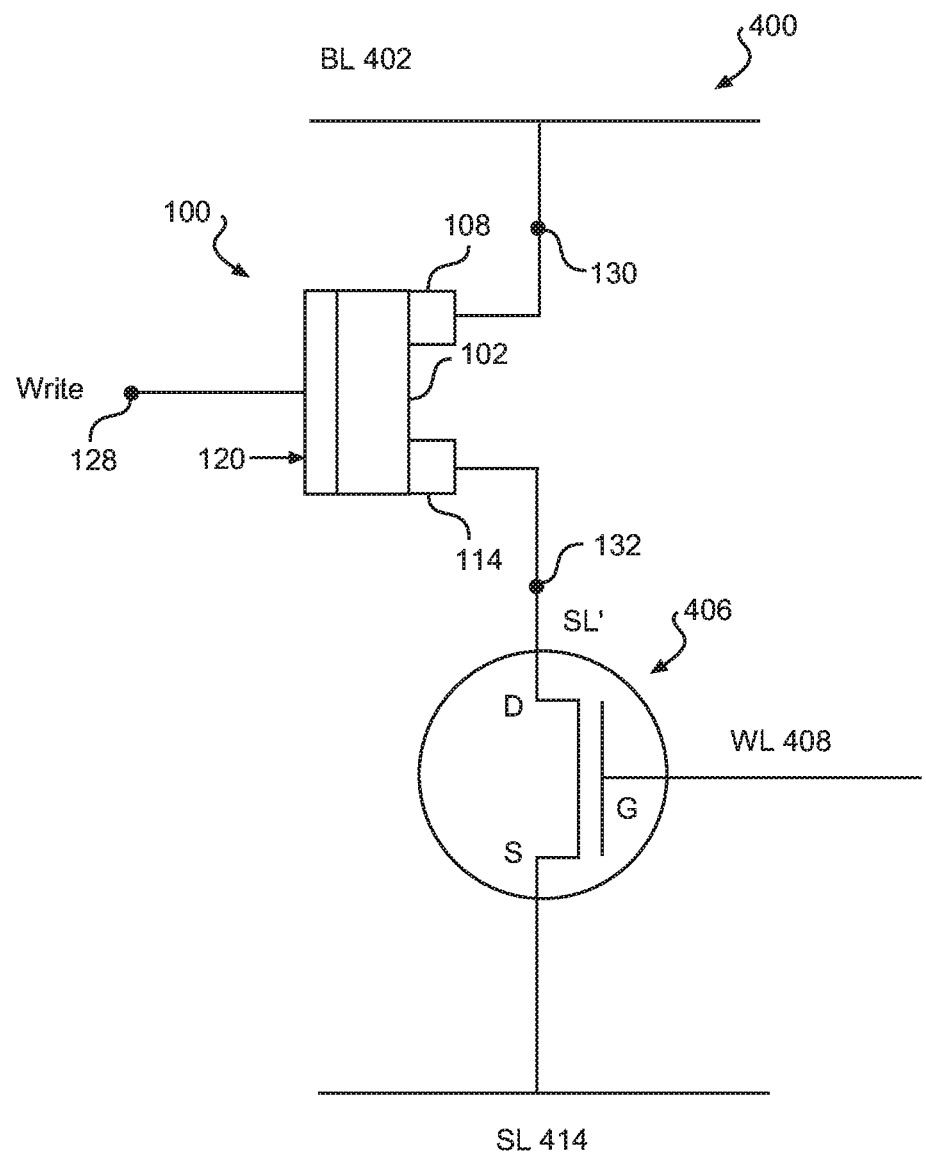
FIG. 4 is a circuit diagram of a memory bit cell employing the resistive memory element of FIG. 1 and an access transistor to control read and write operations to the resistive memory element.

FIG. 4 illustrates the resistive memory element 100 of FIG. 1 in situ to form a memory cell 400. In particular, a bit line (BL) 402 is coupled to the first electrode 108 at the node 130, and a drain D of a transistor 406 is coupled to the second electrode 114 at the node 132. A word line (WL) 408 is coupled to a gate G of the transistor 406, and a source S of the transistor 406 is coupled to a source line (SL) 414. Thus, the signal at the node 132 is a source line bar (SL'). In an exemplary aspect, during a read transaction, the BL 402 has a pulsed voltage of Vdd or Vread (e.g., 0.3 V) for approximately one nanosecond (1 ns), the WL 408 has a pulsed voltage of Vdd, the write line at the node 128 is held at 0.0 V or a fixed voltage, and the SL 414 has a pulsed voltage of 0.0 V. By using a relatively small voltage, the resistive state of the resistive memory element 100 may be ascertained.

To write a one value (1) to the memory cell 400, the BL 402 is held at 0.0 V, the WL 408 has a pulsed voltage of Vdd, the SL 414 has a pulsed voltage of 0 V, and the write line at the node 128 is elevated to Vp (e.g., 3-4 V). While providing a high voltage at the node 128 and holding the voltages at the nodes 130 and 132 low, an electrical field crosses the ferroelectric material 120, which causes the ferroelectric dipole 202 (FIG. 2A) to extend inwardly towards the semiconductive material 102, which in turn lowers the resistance of the resistive memory element 100.

To write a zero value (0) to the memory cell 400, the BL 402 has a pulsed voltage of Vp, the WL 408 has a pulsed voltage of Vdd, the SL 414 has a pulsed voltage of 0V, and the write line at the node 128 is held at 0.0 V. By putting a high voltage at the nodes 130 and 132 and a low voltage at the node 128, an electrical field crosses from the nodes 130 and 132 through the semiconductive material 102 into the ferroelectric material 120. This electrical field causes the ferroelectric dipole 206 (FIG. 2B) to point outwardly away from the semiconductive material 102, which in turn raises the resistance of the resistive memory element 100.

Exemplary aspects of the present disclosure allow the construction of the resistive memory element 100 through patterning and deposition processes. Deposition processes, such as an atomic layer deposition (ALD) process, allow precise control over the thicknesses of the various elements. Such precision is important as node sizes of integrated circuits continue to shrink. Further, relatively few masks may be used in patterning processes. Reuse of masks makes manufacturing easier as well.

Figure 5:
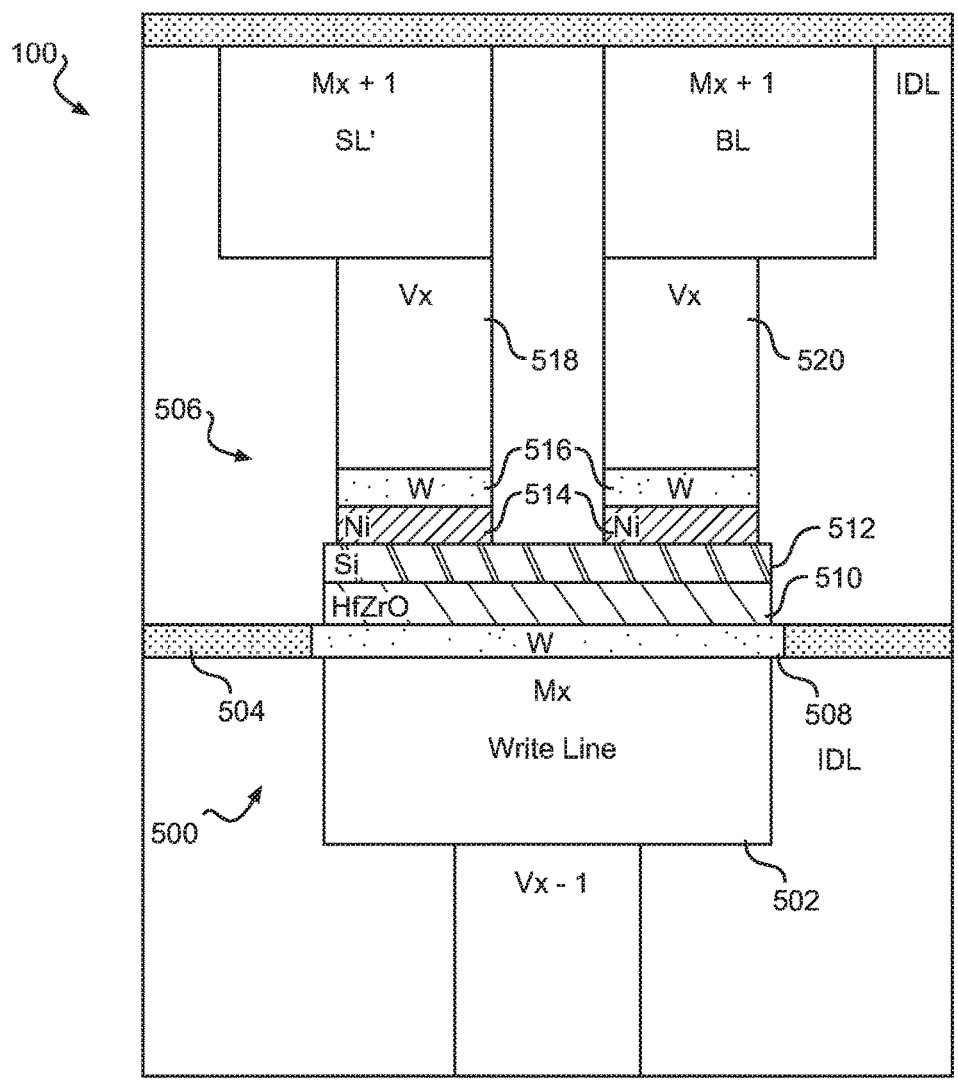
FIG. 5 is a more detailed cross-sectional view of the resistive memory element of FIG. 1 showing the Schottky junctions relative to the semiconductive material and the ferroelectric material.
Figure 6:
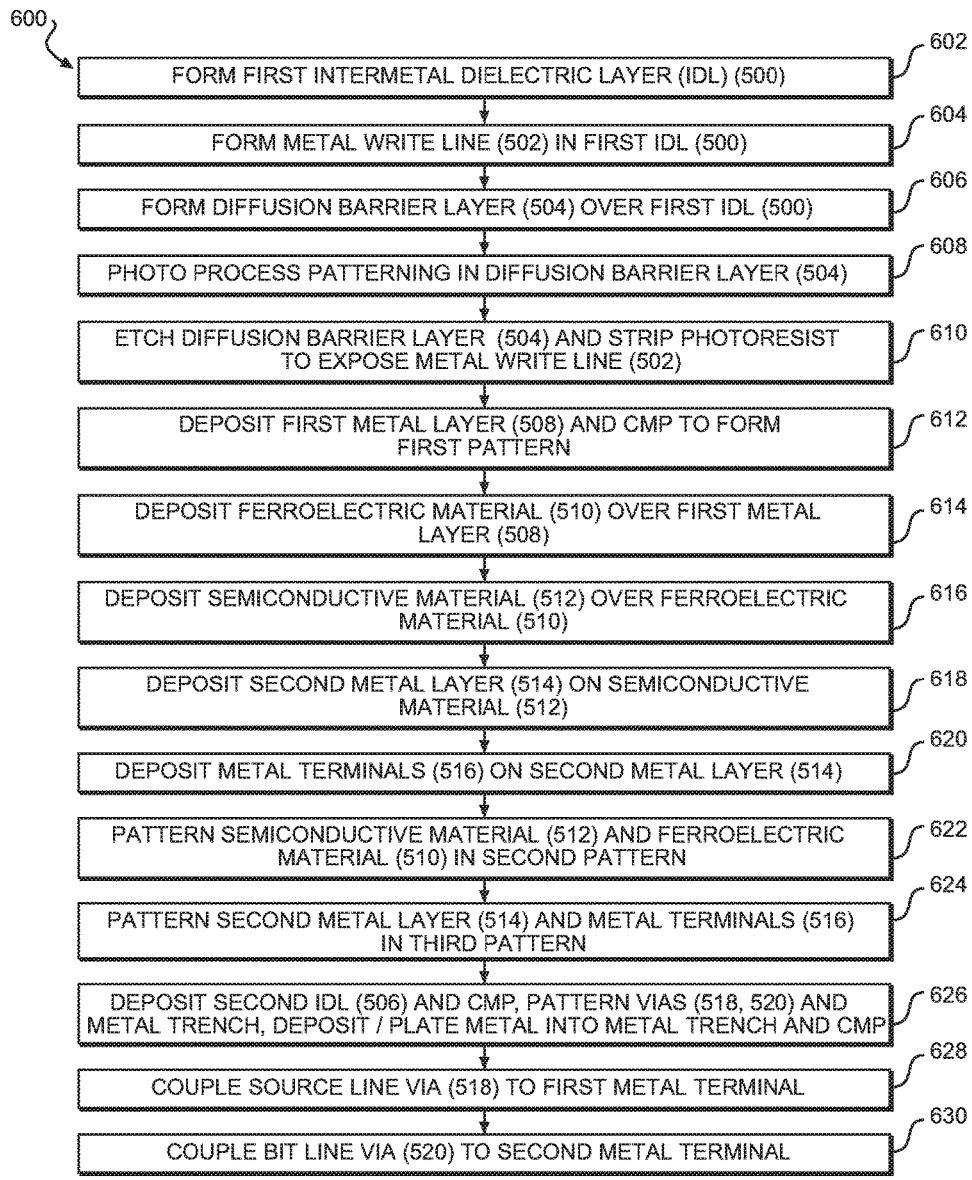
FIG. 6 is a flowchart illustrating an exemplary process for manufacturing the resistive memory element of FIG. 5.

In this regard, FIG. 5 illustrates a more complete cross-sectional view of the resistive memory element 100 of FIG. 1. An overview of a manufacturing process 600 is provided in FIG. 6 with reference to the elements of FIG. 5. In particular, the process 600 begins by providing or forming a first intermetal dielectric layer (IDL or sometimes abbreviated IMD) 500 (block 602). A metal write line 502 is formed within the first IDL 500 (block 604). Formation of metal lines within an IDL is well understood. A diffusion barrier layer 504 is formed over the first IDL 500 (block 606). The diffusion barrier layer 504 electrically insulates metal diffusion in one IDL from others.

The process 600 continues by using photo process patterning in the diffusion barrier layer 504 (block 608). The diffusion barrier layer 504 is etched and photoresist stripped to expose the metal write line 502 (block 610). Having exposed the metal write line 502, a first metal layer 508 is deposited and chemical mechanical polished (CMP) to form a first pattern (block 612). The first metal layer 508 is electrically coupled to the metal write line 502, effectively forming the node 128 of FIG. 1 such that the first metal layer 508 is electrically coupled to the metal write line 502 and forms the write terminal. A ferroelectric material 510 is then deposited over (on) the first metal layer 508 (block 614) such that the ferroelectric material 510 is electrically coupled to the write terminal. A semiconductive material 512 is then deposited over (on) the ferroelectric material 510 (block 616). A second metal layer 514 is deposited on the semiconductive material 512 (block 618). Metal terminals 516 are deposited on top of the second metal layer 514 (block 620). A third metal layer is deposited on the metal terminals 516. The semiconductive material 512 and the ferroelectric material 510 are patterned in a second pattern (block 622). The third metal layer, the second metal layer 514 and the metal terminals 516 are patterned in a third pattern (block 624). The third metal layer forms vias 518 and 520.

The process 600 continues by depositing a second IDL 506 and CMP, patterning the vias 518 and 520 and a metal trench, and depositing or plating metal into the metal trench and CMP (block 626), coupling a source line via 518 to the first metal terminal (block 628) and then coupling a bit line via 520 to the second metal terminal (block 630).

Figure 7:
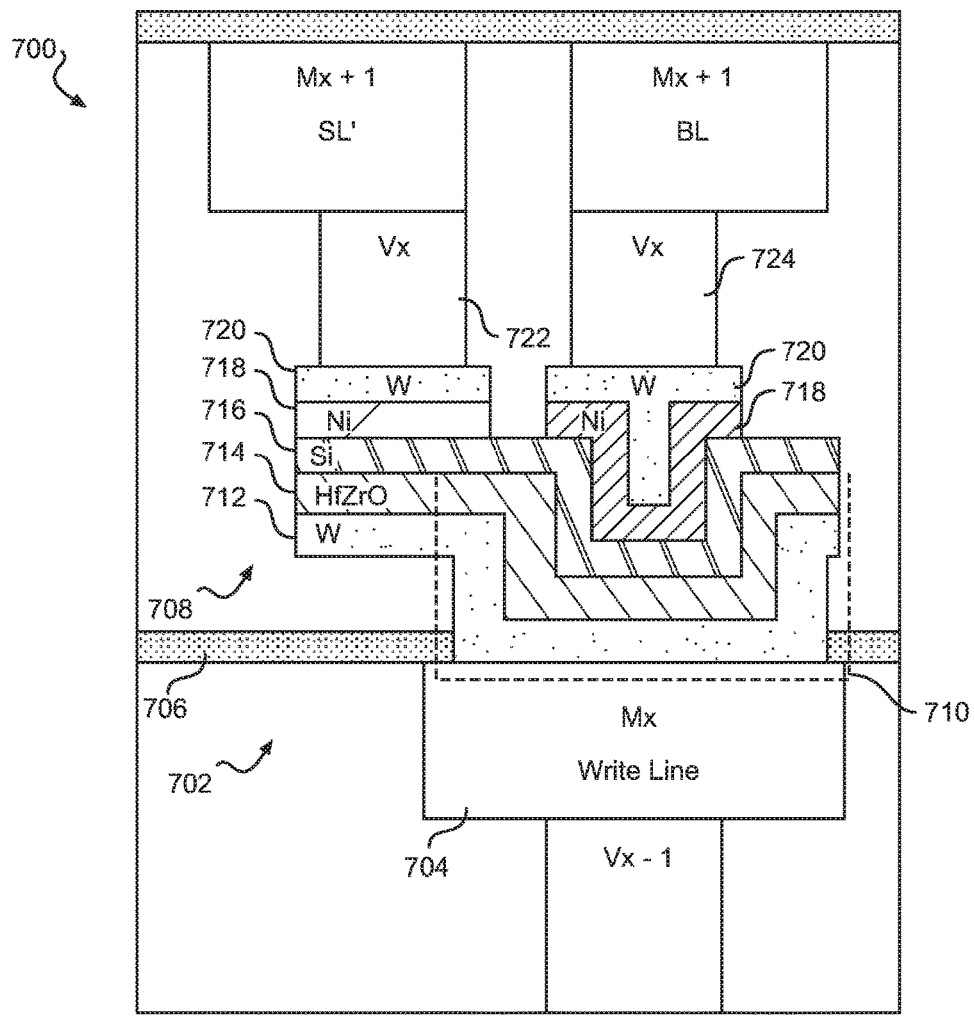
FIG. 7 is a cross-sectional view illustrating a resistive memory element substantially similar to the resistive memory element of FIG. 5, but manufactured using a trenching process to increase the surface area of the ferroelectric material relative to the semiconductive material.

While the process 600 provides a simple structure that is relatively easy to manufacture even at small node sizes, there are other three-terminal aspects which also fall within the scope of the present disclosure. Thus, a trenching process could also be used. Trenching may allow the ferroelectric material to have a larger area of the ferroelectric dipole in the semiconductive material and thus may provide a more robust write function. In this regard, FIG. 7 illustrates a resistive memory element 700 that is substantially similar to the resistive memory element 100 illustrated in FIGS. 1 and 5. In particular, the resistive memory element 700 includes an IDL 702 with a write line 704 formed therein. A diffusion layer 706 is formed above the IDL 702 and the write line 704. A second IDL 708 is formed above the diffusion layer 706 and trenched to form a trench 710. A metal terminal 712 is deposited in the trench 710 and over a portion of the second IDL 708. A ferroelectric material 714 is deposited over the metal terminal 712. A semiconductive material 716 is deposited over the ferroelectric material 714. A metal layer 718 is then deposited over a first and second portion of the semiconductive material 716 to form the two Schottky junctions. Metal terminals 720 are then deposited on the metal layer 718. A source line via 722 is formed over a first metal terminal 720 and a bit line via 724 is formed over a second metal terminal 720.

Figure 8A:
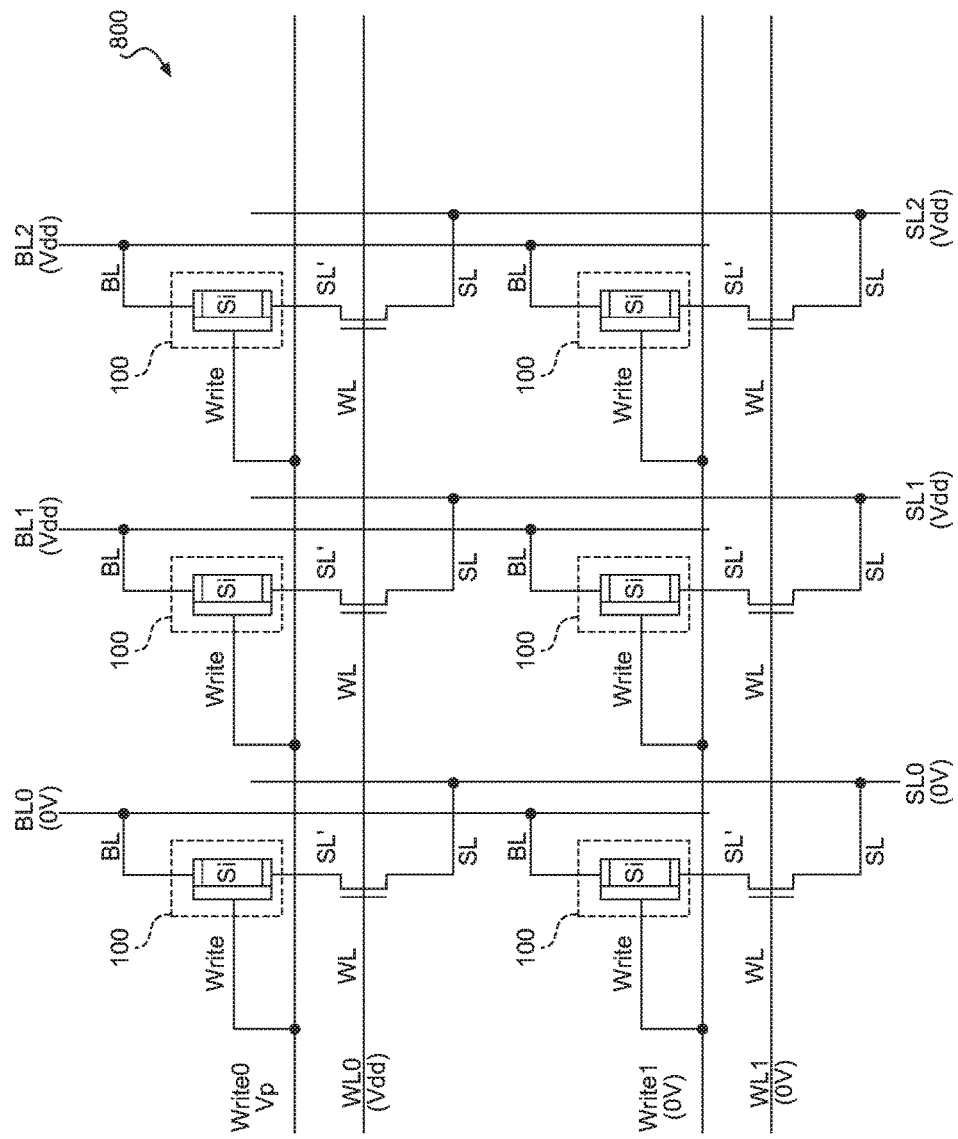
FIGS. 8A-8C are schematic diagrams of a memory array formed of plural resistive memory elements and illustrating the various voltages to write a one value (1) or a zero value (0) into the memory array or read from the memory array.
Figure 8B:
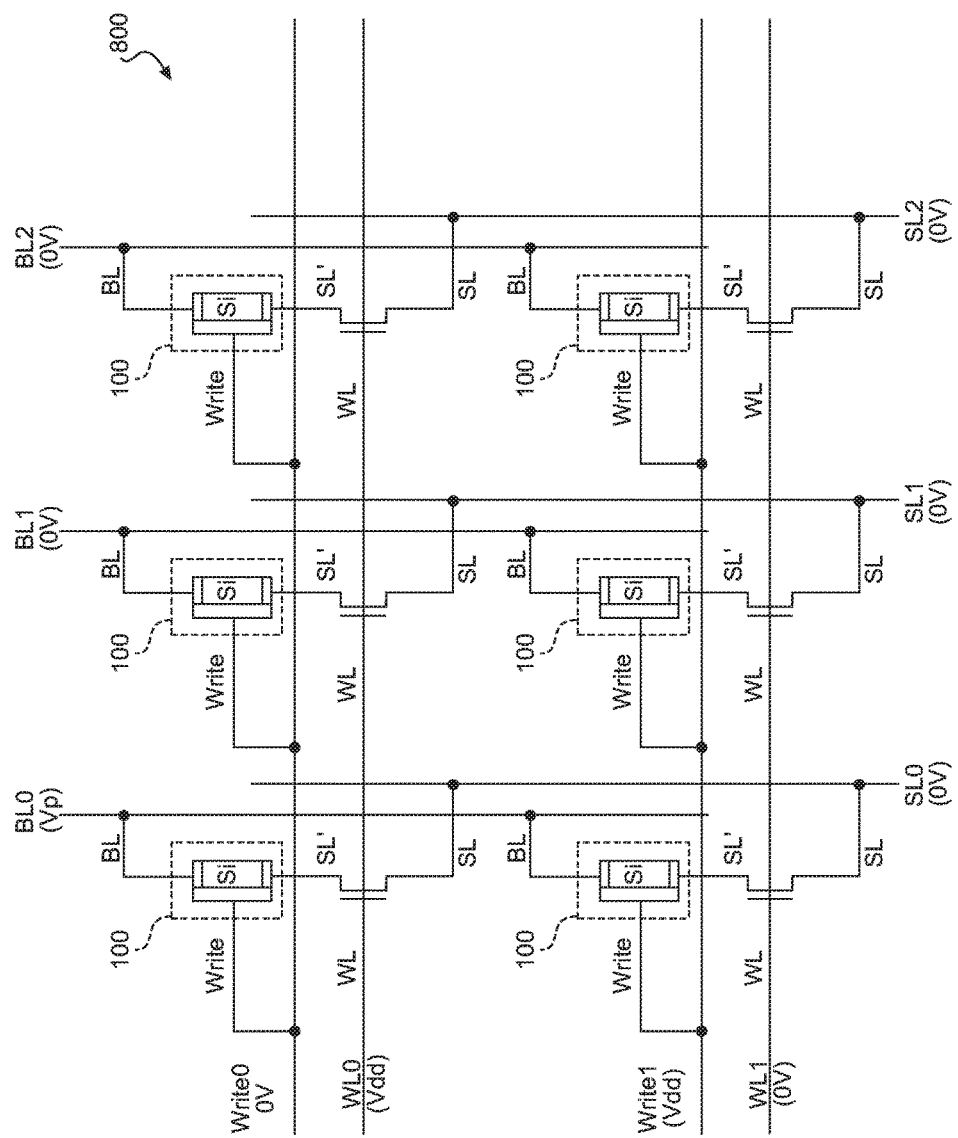
Figure 8C:
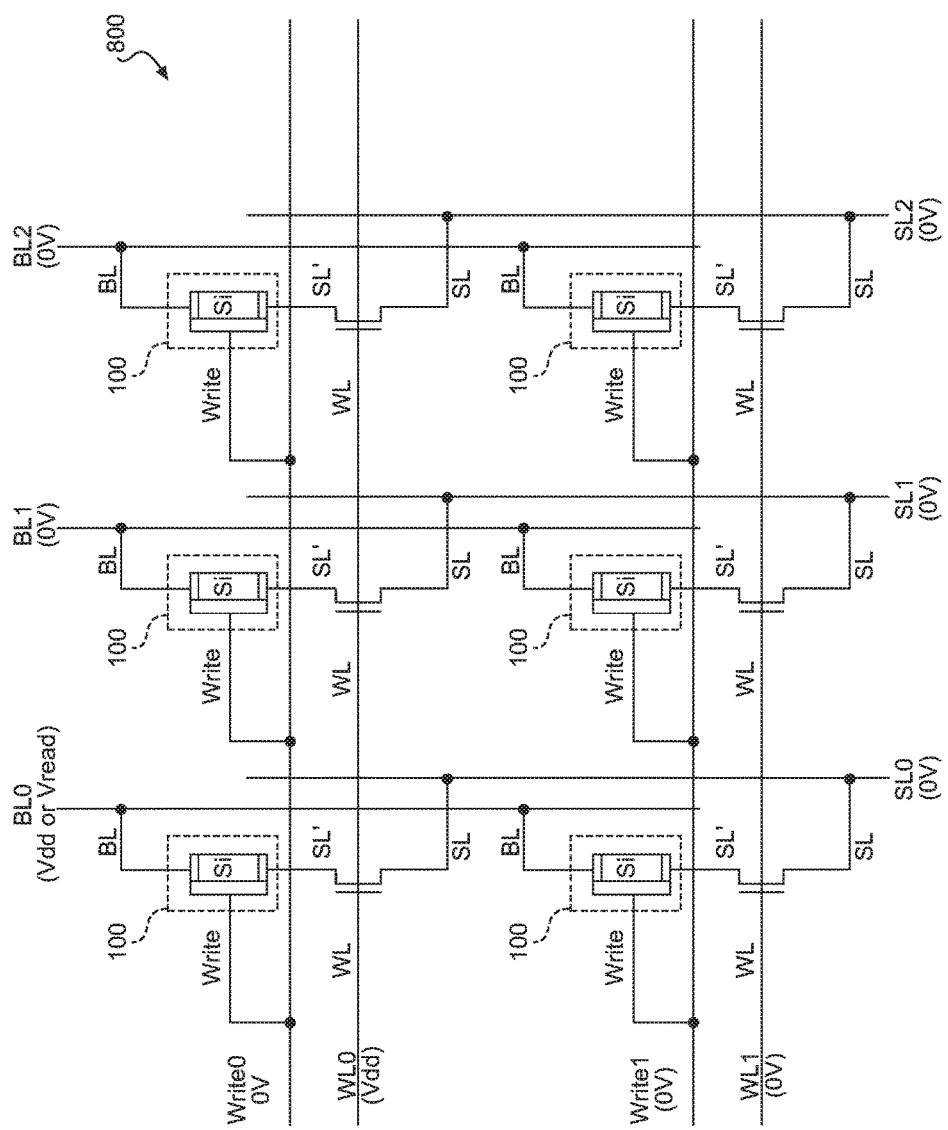

FIGS. 8A-8C show a memory array 800 formed of plural resistive memory elements 100 (or 700). FIG. 8A shows the various voltages to write a one value (1) into the memory array. FIG. 8B shows the various voltages to write a zero value (0) into the memory array. FIG. 8C shows the various voltages to read from the memory array. The three-terminal arrangement of the resistive memory element 100 (or 700) makes it easier to control an array with the distinct write lines. By applying different WL, write line, BL, and SL voltages, the selected memory cell of the memory array has full write voltage to switch, and the unselected memory cells use half voltage select to avoid switching. An exemplary set of voltages to be used is set forth in Tables 1 and 2 below.

TABLE 1

Selected Memory Cell Voltages

| Operation | Write "1" | Write "0" | Read |
|---|---|---|---|
| WL | Vdd | Vdd | Vdd |
| BL | 0 V | Vp (3-4 V) | Vread or Vdd |
| SL | 0 V | 0 V | 0 V |
| Write Line | Vp (3-4 V) | 0 V | 0 V |

TABLE 2

Unselected Memory Cell Voltages

| Unselect Operation | Unselect (same write line) | Unselect (diff write line) | Remark |
|---|---|---|---|
| WL | Vdd | 0 V | |
| BL | Vdd or 0 V | Vdd or 0 V | Use half select to avoid switching |
| SL | Vdd or 0 V | Vdd or 0 V | Use half select to avoid switching |
| Write Line | Vp (3~4 V) or 0 V | 0 V or Vdd | |

Figure 9:
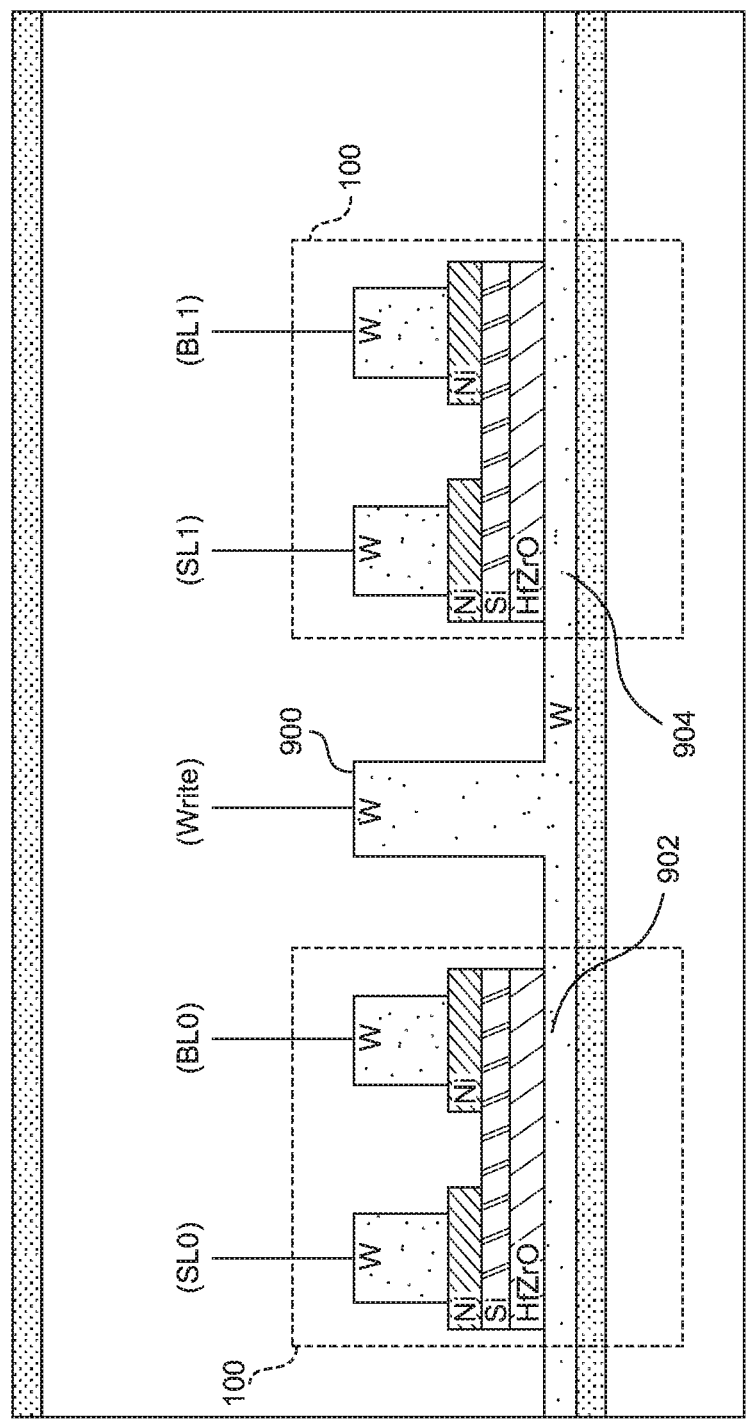
FIG. 9 is a cross-sectional view illustrating a possible structure for multiple resistive memory elements such as could be used in the memory array of FIGS. 8A-8C having a shared write line.

FIG. 9 illustrates a possible cross-sectional structure for multiple resistive memory elements 100 such as could be used in the memory array 800 having a shared write terminal 900. The shared write terminal 900 extends between and is coupled to two (or more) resistive memory elements 100 of the memory array. It should be appreciated that the shared write terminal 900 is formed from a write metal layer analogous to the metal layer used to form the write terminal 122 of FIG. 1, and thus portions 902 and 904 of the shared write terminal 900 are directly analogous to the write terminal 122 of FIG. 1.

Figure 10:
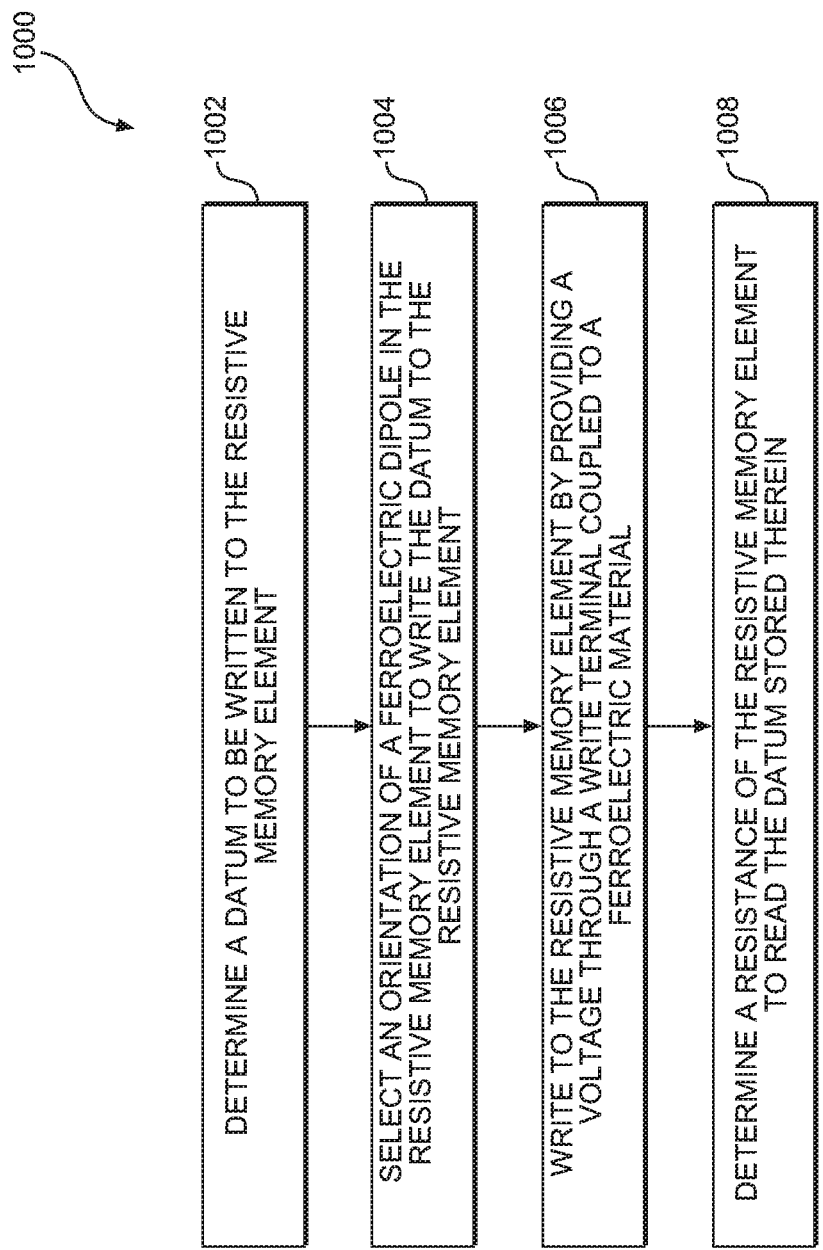
FIG. 10 is a flowchart illustrating an exemplary process for using a resistive memory element.

FIG. 10 illustrates a flowchart for a process 1000 of using a resistive memory element 100. In this regard, the process 1000 includes determining a datum to be written to the resistive memory element 100 (block 1002). The process 1000 continues by selecting an orientation of a ferroelectric dipole in the resistive memory element 100 to write the datum to the resistive memory element 100 (block 1004). The process 1000 continues by writing to the resistive memory element 100 by providing a voltage through a write terminal coupled to a ferroelectric material (block 1006). The process 1000 continues by determining a resistance of the resistive memory element 100 to read the datum stored therein (block 1008).

The ferroelectric-modulated Schottky non-volatile memory according to aspects disclosed herein may be provided in or integrated into any processor-based device. Examples, without limitation, include a set top box, an entertainment unit, a navigation device, a communications device, a fixed location data unit, a mobile location data unit, a global positioning system (GPS) device, a mobile phone, a cellular phone, a smart phone, a session initiation protocol (SIP) phone, a tablet, a phablet, a server, a computer, a portable computer, a mobile computing device, a wearable computing device (e.g., a smart watch, a health or fitness tracker, eyewear, etc.), a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, an automobile, a vehicle component, avionics systems, a drone, and a multicopter.

Figure 11:
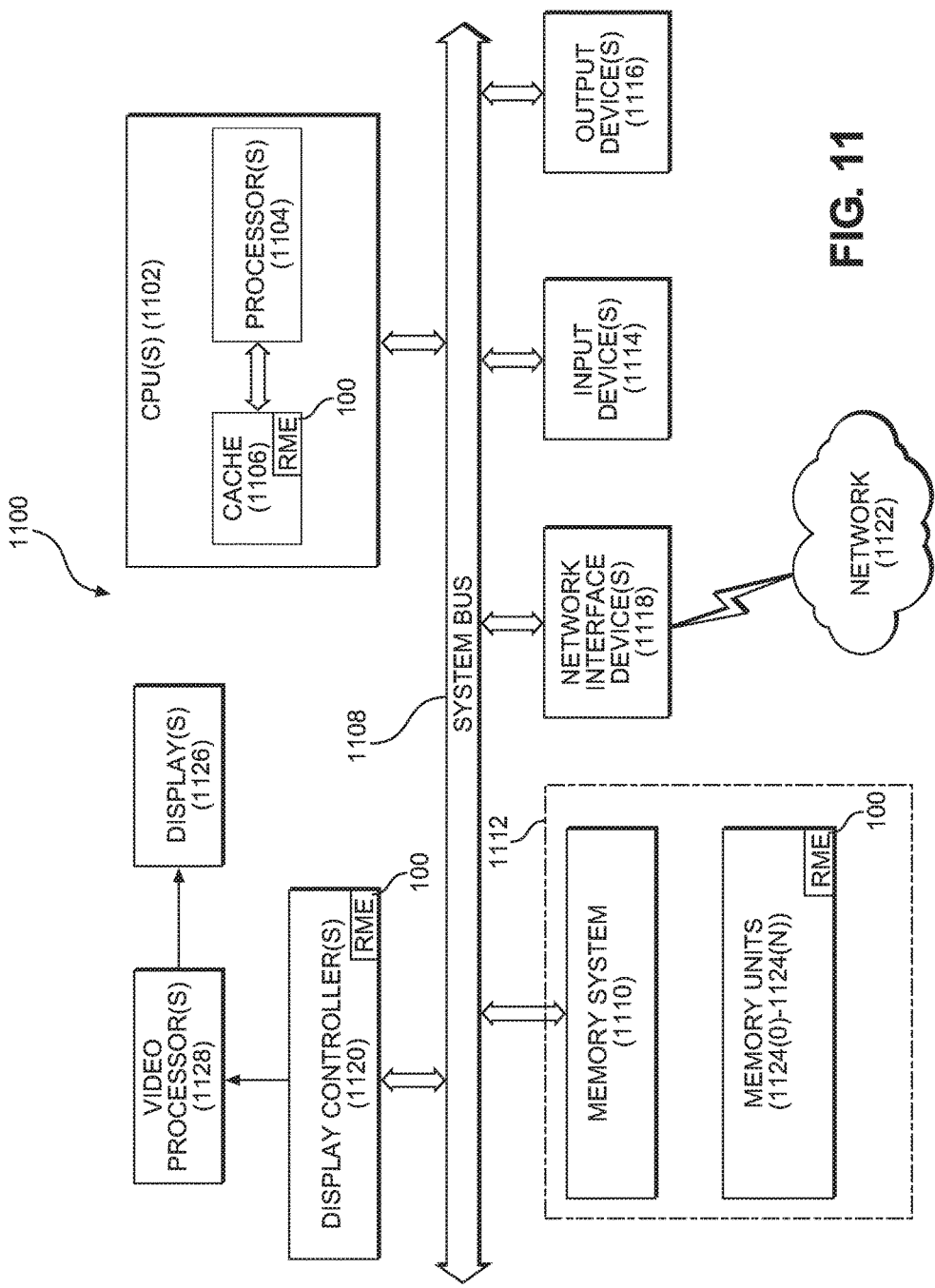
FIG. 11 is a block diagram of an exemplary processor-based system that can include the resistive memory element of FIG. 1.

In this regard, FIG. 11 illustrates an example of a processor-based system 1100 that can employ the resistive memory element 100 illustrated in FIG. 1. In this example, the processor-based system 1100 includes one or more central processing units (CPUs) 1102, each including one or more processors 1104. The CPU(s) 1102 may have cache memory 1106, which may be in the form of a memory array formed from resistive memory elements (referenced in FIG. 11 as "RME"), and coupled to the processor(s) 1104 for rapid access to temporarily stored data. The CPU(s) 1102 is coupled to a system bus 1108 and can intercouple master and slave devices included in the processor-based system 1100. As is well known, the CPU(s) 1102 communicates with these other devices by exchanging address, control, and data information over the system bus 1108. For example, the CPU(s) 1102 can communicate bus transaction requests to a memory controller 1110 as an example of a slave device. Although not illustrated in FIG. 11, multiple system buses 1108 could be provided, wherein each system bus 1108 constitutes a different fabric.

Other master and slave devices can be connected to the system bus 1108. As illustrated in FIG. 11, these devices can include a memory system 1112, one or more input devices 1114, one or more output devices 1116, one or more network interface devices 1118, and one or more display controllers 1120, as examples. The input device(s) 1114 can include any type of input device, including, but not limited to, input keys, switches, voice processors, etc. The output device(s) 1116 can include any type of output device, including, but not limited to, audio, video, other visual indicators, etc. The network interface device(s) 1118 can be any devices configured to allow exchange of data to and from a network 1122. The network 1122 can be any type of network, including, but not limited to, a wired or wireless network, a private or public network, a local area network (LAN), a wireless local area network (WLAN), a wide area network (WAN), a BLUETOOTH™ network, and the Internet. The network interface device(s) 1118 can be configured to support any type of communications protocol desired. The memory system 1112 can include one or more memory units 1124(0)-1124(N), which may include one or more RMEs 100.

The CPU(s) 1102 may also be configured to access the display controller(s) 1120 over the system bus 1108 to control information sent to one or more displays 1126. The display controller(s) 1120 may include one or more RMEs 100. The display controller(s) 1120 sends information to the display(s) 1126 to be displayed via one or more video processors 1128, which process the information to be displayed into a format suitable for the display(s) 1126. The display(s) 1126 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A resistive memory element, comprising:
   a semiconductive material layer comprising a first portion and a second portion;
   a first metal element, positioned adjacent to the first portion, forming a first Schottky junction with the semiconductive material layer;
   a second metal element, spaced apart from the first metal element and positioned adjacent to the second portion, forming a second Schottky junction with the semiconductive material layer; and
   a ferroelectric material layer adjacent to the semiconductive material layer, the ferroelectric material layer being configured to generate an electric field into the semiconductive material layer, which is based on a voltage applied to the ferroelectric material layer, that changes a Schottky barrier height of the first or second Schottky junctions and changes a resistance associated with the semiconductive material layer.

2. The resistive memory element of claim 1, further comprising:
   a first metal terminal coupled to and proximate the first Schottky junction;
   a second metal terminal coupled to and proximate the second Schottky junction; and
   a third metal terminal coupled to and proximate the ferroelectric material layer.

3. The resistive memory element of claim 2, wherein the first, second, and third metal terminals comprise tungsten (W).

4. The resistive memory element of claim 2, wherein the first metal terminal is configured to provide a source line input;
   wherein the second metal terminal is configured to provide a bit line input; and
   wherein the third metal terminal is configured to provide a write input.

5. The resistive memory element of claim 4, further comprising a transistor coupled to the source line input, wherein the transistor comprises a gate and the gate is coupled to a word line input.

6. The resistive memory element of claim 1, wherein the first metal element and the second metal element comprise nickel (Ni).

7. The resistive memory element of claim 1, wherein the ferroelectric material layer comprises a Hafnium zirconium oxide (HfZrOx) material.

8. The resistive memory element of claim 1, wherein the ferroelectric material layer comprises a Hafnium aluminum oxide (HfAlOx) material.

9. The resistive memory element of claim 1, wherein the ferroelectric material layer comprises a Hafnium silicon oxide (HfSiOx) material.

10. The resistive memory element of claim 1, wherein the semiconductive material layer comprises a silicon (Si) semiconductor material.

11. The resistive memory element of claim 1, wherein the first metal element and the second metal element are both positioned on a first side of the semiconductive material layer and the ferroelectric material layer is positioned on a second side of the semiconductive material layer opposite the first side.

12. The resistive memory element of claim 1, wherein the semiconductive material layer forms a trench.

13. The resistive memory element of claim 1 integrated into a memory array.

14. The resistive memory element of claim 13, further comprising a shared write terminal coupled to two resistive memory elements of the memory array, wherein a write metal layer is configured to provide the shared write terminal.

15. The resistive memory element of claim 1 integrated into an integrated circuit (IC).

16. The resistive memory element of claim 1 integrated into a device selected from the group consisting of: a set top box; an entertainment unit; a navigation device; a communications device; a fixed location data unit; a mobile location data unit; a global positioning system (GPS) device; a mobile phone; a cellular phone; a smart phone; a session initiation protocol (SIP) phone; a tablet; a phablet; a server; a computer; a portable computer; a mobile computing device; a wearable computing device; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; an automobile; a vehicle component; avionics systems; a drone; and a multicopter.

17. A method of operating a resistive memory element, the method comprising:
   determining a datum to be written to the resistive memory element having a first Schottky junction and a second Schottky junction at a first terminal and a second terminal, respectively, of the resistive memory element;
   selecting an orientation of a ferroelectric dipole of a ferroelectric material in the resistive memory element to write the datum to the resistive memory element;
   writing the datum to the resistive memory element by providing voltages through the first terminal, the second terminal, and a write terminal of the resistive memory element that change a Schottky barrier height of the first Schottky junction or the second Schottky junction, and change a resistance of the resistance memory element by changing the orientation of the ferroelectric dipole to the orientation selected by the selecting; and determining the resistance of the resistive memory element to read the datum stored therein.

18. The method of claim 17, wherein changing the orientation of the ferroelectric dipole to the orientation selected by the selecting comprises changing the orientation to a first selected orientation based on a first voltage and changing the orientation to a second selected orientation based on a second voltage.

* * * * *